United States Patent [19]
Swanson

[11] Patent Number: 5,666,036
[45] Date of Patent: Sep. 9, 1997

[54] CIRCUIT FOR DRIVING THE MOTOR OF A TEMPERATURE BLEND DOOR

[75] Inventor: David Frank Swanson, Howell, Mich.

[73] Assignee: SGS-Thomson Microelectronics, Inc., Carrollton, Tex.

[21] Appl. No.: 456,060

[22] Filed: May 31, 1995

[51] Int. Cl.$^6$ ........................................................ H02P 1/22
[52] U.S. Cl. .............................. 318/295; 318/266; 318/286; 318/293
[58] Field of Search ........................ 318/280, 283, 318/286, 287, 291, 293, 294, 295, 256, 264, 265, 266, 466, 467, 468, 470, 652, 663, 666, 667

[56] References Cited

U.S. PATENT DOCUMENTS

| | | |
|---|---|---|
| 2,134,901 | 11/1938 | Wey . |
| 3,146,390 | 8/1964 | Wolff . |
| 3,586,949 | 6/1971 | Spear et al. . |
| 3,617,849 | 11/1971 | Charlton . |
| 3,697,871 | 10/1972 | MacMullan . |
| 3,776,111 | 12/1973 | Maida . |
| 4,388,571 | 6/1983 | Tada et al. . |

OTHER PUBLICATIONS

Schilling, Donald et al.: Electronic Circuits: Discrete and Integrated, 3rd edition, Chapters 7.8 and 7.9 (pp. 362–368), McGraw-Hill, 1989.

*Primary Examiner*—Bentsu Ro
*Attorney, Agent, or Firm*—Theodore E. Galanthay; Lisa K. Jorgenson; Irena Lager

[57] ABSTRACT

A circuit for driving a motor used to control the HVAC blend door in an automobile is disclosed. The circuit includes an amplifier circuit, a motor, and a three state driver circuit. The driver circut includes three NPN bipolar transistors and two PNP bipolar transistors configured such that the output of the three state driver circuit is turned off if the input is at a intermediate voltage. The output of the three state driver circuit is at a high voltage if the input is at a low voltage. Conversely, the output of the three state driver circuit is at low voltage when the input is at a high voltage.

19 Claims, 1 Drawing Sheet

CIRCUIT FOR DRIVING THE MOTOR OF A TEMPERATURE BLEND DOOR

BACKGROUND OF THE INVENTION

1. Field of the Invention

This invention relates to electronic circuits used for driving a motor used to actuate a Heating-Ventilation-Air Conditioning (HVAC) blend door in an automobile.

2. Description of the Relevant Art

The problem addressed by this invention is encountered in the automotive industry where the temperature of the passenger area of an automobile is controlled by moving a temperature control, typically located on the dashboard. By moving the temperature control, the blend of fresh air and hot air is modified. The temperature control is typically attached to a potentiometer which generates a control voltage proportional to the position of the temperature control. The control voltage can also be generated by an automotive temperature control module.

FIG. 1 is a schematic drawing of a prior art circuit for controlling the position of an HVAC blend door responsive to the control voltage through resistor 8. The HVAC blend door is attached to the shaft motor 24, but is not shown in this drawing. In this circuit for controlling the position of and HVAC blend door, an operational amplifier 20 and 28 control the position of motor 24. The motor 24 also has a potentiometer 6 attached to the shaft of the motor such that the rotation of the motor results in the rotation of the potentiometer 6 as well as the blend door. Thus, the motor is positioned by changing the control voltage which is sensed on the inverting input of amplifier 20. The output of amplifier 20 responds to the control voltage in either a high or a low voltage. Because of the interconnection through resistor 22, amplifier 28 responds to the control voltage with an opposite output voltage as amplifier 20. Thus, motor 24 is rotated in a first direction when the control voltage is increased and is rotated in a second direction when the control voltage is decreased.

As motor 24 rotates, the blend door and the potentiometer rotates. Consequently, the voltage on the sweeper of the potentiometer approaches the control voltage which causes the outputs of amplifiers 20 and 28 to return to their static voltages until the temperature control is moved again.

As discussed above, the circuit is used in automobile where the circuit is exposed to harsh temperatures and to severe shock and vibration. Additionally, the automotive industry is very cost sensitive since the success of a particular automobile is very price sensitive.

SUMMARY OF THE INVENTION

Therefore, it is an object of the invention to reduce the number of components used to drive the blend door motor so that the reliability of the circuit is increased and the cost of the circuit is decreased. These and other objects, features, and advantages of the invention will be apparent to those skilled in the art from the following detailed description of the invention, when read with the drawings and appended claims.

The invention can be summarized as a circuit for driving a motor used to control the HVAC blend door in an automobile. The circuit includes an amplifier circuit, a motor, and a driver circuit. The driver circuit includes three NPN bipolar transistors and two PNP bipolar transistors.

DETAILED DESCRIPTION OF THE PREFERRED EMBODIMENT

Figure 1:
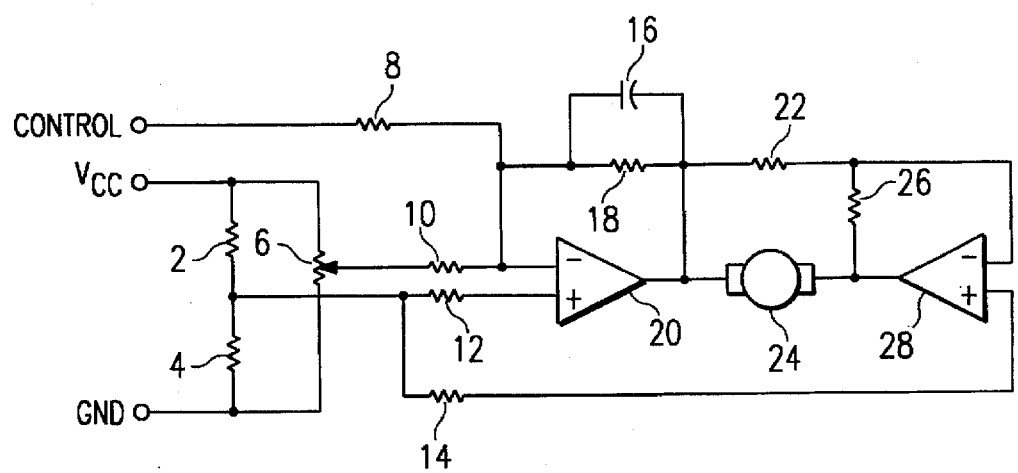
FIG. 1 is an schematic drawing of a circuit for driving a motor used to control the HVAC blend door in an automobile, as known in the prior art.
Figure 2:
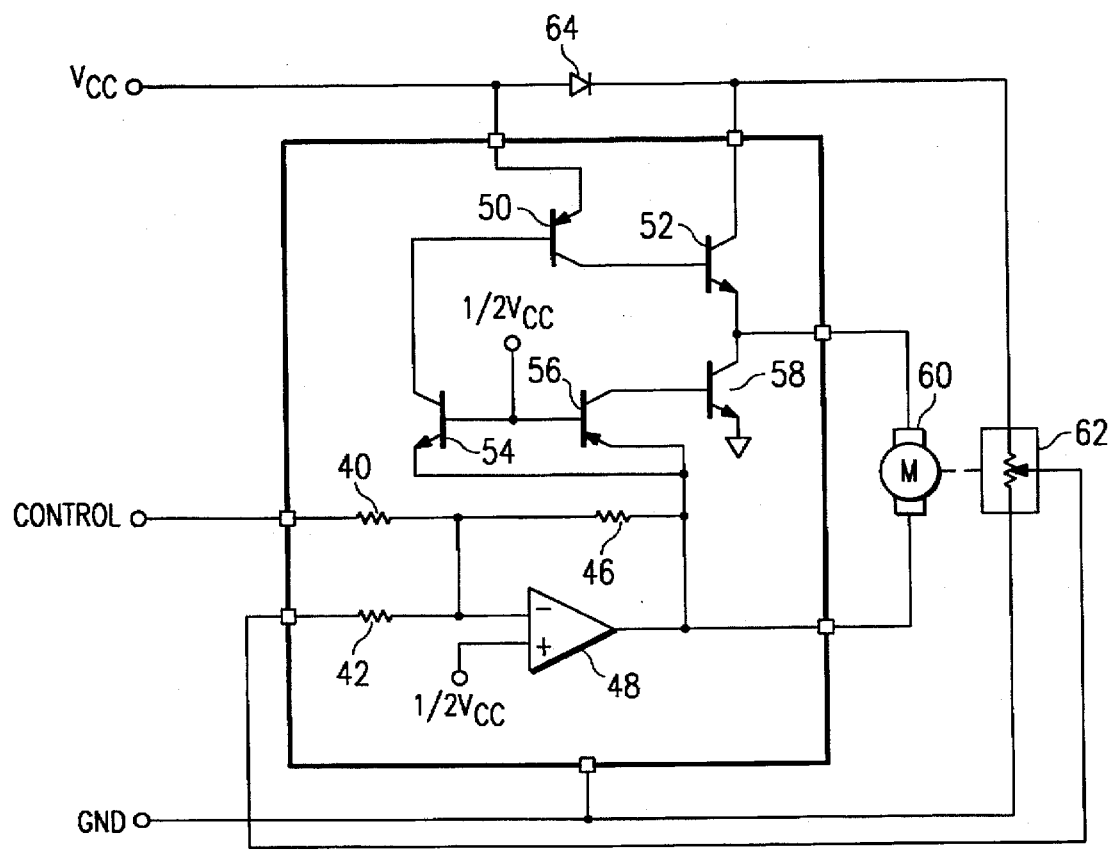
FIG. 2 is the preferred embodiment of a circuit for driving a motor used to control the HVAC blend door in an automobile.

A circuit for driving a motor used to control the HVAC blend door in an automobile constructed according to a the preferred embodiment of the invention will be described. FIG. 2 shows a schematic drawing of the circuit which includes an amplifier stage, a motor with potentiometer connected to the shaft, and a three state driver circuit.

The amplifier stage is constructed by having a first end of a resistor 40 for receiving the control voltage and having a second end connected to a first end of resistor 46, an inventing input of an operational amplifier 48, and a second end of a resistor 42. The first end of resistor 42 is connected a sweeper of the potentiometer connected to the shaft of motor 60 through a gear reduction system. The non-inverting input of amplifier 48 is connected to a reference voltage, ½ Vcc in this example. The output of amplifier 48 is connected to the first input of the motor 60, the second end of resistor 46, and the input of the three state driver circuit.

The three state driver circuit is constructed by connecting the emmitter of PNP bipolar transistor 56 to the emitter of NPN bipolar transistor 54 to form the input of the three state driver circuit. The bases of transistors 54 and 56 are connected to the reference voltage, ½ Vcc. The collector of transistor 56 is connected to a base of a NPN bipolar transistor 58 which has its emitter connected to ground. The collector of transistor 58 is connected to an emitter of an NPN bipolar transistor 52, the connection forming the output of the three state driver circuit. The collector of transistor 52 is connected to a Vcc voltage through a diode 64, which is optional yet shown in this diagram. The base of transistor 52 is connected to a collector of a PNP bipolar transistor 50. The base of transistor 50 is connected to the collector of transistor The emitter of transistor 50 is connected to the Vcc Voltage.

In operation, the motor 60 is rotated by the amplifier stage and the three state driver circuit creating a voltage potential across the motor. This occurs when the control voltage is increased or decreased. When the control voltage is increased, the output voltage of amplifier 48 decreases from its steady state voltage of around ½ Vcc to a ground voltage. Since the output of amplifier 48 is connected to the input of the three state driver, the output of the amplifier 48 forward bias transistor 54 which turns on transistor 50 and thus transistor 52. Thus, the output of the three state driver circuit has switched from being off to a state where the Vcc voltage is applied to the second input of motor 60 while the first input of motor 60 is clamped to around ground. Thus, the motor rotates in a first direction which rotates the potentiometer 62. Consequently, the voltage on sweeper of the potentiometer changes until it reaches the same level as the control voltage. the potentiometer approaches the intended resting point, the amplifier 48 output will begin to rise to the ½ Vcc point. As amplifier 48 reaches the ½ Vcc point, the three state driver reaches the high impedance state.

Conversely, the output of the amplifier stage swings to a high voltage when the control voltage is decreased. The high voltage forward biases transistor 56 which turns on transistor 58. Thus, the motor is subjected to a voltage potential of opposite polarity which causes the motor 60 to rotate in the opposite direction. Consequently, the voltage on the sweeper is increased until it is about equal to the control voltage. At that instance, the output of the amplifier stage returns to around ½ Vcc and the three state driver stage is turned off.

In summary, the output of three state driver is off when the output of the amplifier circuit is at a stable voltage (½ Vcc), or at high voltage when the amplifier circuit is at a low voltage, or at a low voltage when the amplifier circuit is at a high voltage.

It has been observed that a three state driver circuit as described above uses fewer electronic components than the prior art circuits. Fewer resistors are required and the combination of transistors used for the three state driver circuit uses fewer transistors than the operational amplifier of the prior art circuit. Consequently, it has been observed that the disclosed invention is less expensive to manufacture while being more reliable.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for driving a motor used to control an HVAC blend door comprising:
   a motor having a first input, a second input, and a shaft connected to the HVAC blend door and a potentiometer having an output;
   an amplifier stage having a first input for receiving a control voltage, having a second input connected to the output of the potentiometer, having a third input connected to a reference voltage and having an output connected to the first in put of the motor; and
   a three state driver circuit having an input connected to the output of the amplifier stage and having an output connected to the second input of the motor, the output of the three state driver circuit being turned off when the output of the amplifier stage is at a steady state voltage, the amplitude of the voltage at the output of the three state driver circuit, when the three state driver circuit is mined on, being different from the amplitude of the voltage at the output of the amplifier stage.

2. The circuit of claim 1 wherein the three state driver circuit comprises:
   a first transistor having an emitter, having a base, and having a collector;
   a second transistor having an emitter connected to the emitter of the first transistor and forming the input of the three state driver circuit, having a base connected to the base of the first transistor and to a voltage reference, and having a collector;
   a third transistor having an emitter connected to ground, having a base connected to the collector of the second transistor, and having a collector;
   a fourth transistor having an emitter connected to a voltage source Vcc, having a base connected to the collector of the first transistor, and having a collector; and
   a fifth transistor having an emitter connected to the collector of the third transistor and forming the output of the three state driver circuit, having a base connected to the collector of the fourth transistor, and having a collector connected to the voltage source.

3. The circuit of claim 2 wherein the three state driver circuit further comprises a diode having an anode connected to the emitter of the fourth transistor and having a cathode connected to the collector of the fifth transistor as its voltage source.

4. The circuit of claim 2 wherein the first, third, and fifth transistors are NPN bipolar transistors.

5. The circuit of claim 2 wherein the second and fourth transistors are PNP bipolar transistors.

6. A three state driver circuit for driving one side of a motor, the three state driver circuit comprising:
   an input connected to an output of an amplifier stage;
   an output connected to a second input of the motor, the output of the three state driver circuit being turned off when the output of the amplifier stage is at a steady state voltage;
   a first transistor having an emitter, having a base, and having a collector;
   a second transistor having an emitter connected to the emitter of the first transistor and forming the input of the three state driver circuit, having a base connected to the base of the first transistor and to a voltage reference, and having a collector;
   a third transistor having an emitter connected to ground, having a base connected to the collector of the second transistor, and having a collector;
   a fourth transistor having an emitter connected to a voltage source Vcc, having a base connected to the collector of the first transistor, and having a collector; and
   a fifth transistor having an emitter connected to the collector of the third transistor and forming the output of the three state driver circuit, having a base connected to the collector of the fourth transistor, and having a collector connected to the voltage source.

7. The circuit of claim 6 further comprising a diode having an anode connected to the emitter of the fourth transistor and having a cathode connected to the collector of the fifth transistor as its voltage source.

8. The circuit of claim 6 wherein the first, third, and fifth transistors are NPN bipolar transistors.

9. The circuit of claim 6 wherein the second and fourth transistors are PNP bipolar transistors.

10. An automobile having a temperature control system wherein the temperature control system includes a circuit for driving a motor used to control an HVAC blend door comprising:
    a motor having a first input, a second input, and a shaft connected to the HVAC blend door and a potentiometer having an output;
    an amplifier stage having a first input for receiving a control voltage, having a second input connected to the output of the potentiometer, having a third input connected to a reference voltage and having an output connected to the first input of the motor; and
    a three state driver circuit having an input connected to the output of the amplifier stage and having an output connected to the second input of the motor, the output of the three state driver circuit being turned off when the output of the amplifier stage is at a steady state voltage, the amplitude of the voltage at the output of the three state driver circuit, when the three state driver circuit is mined on, being different from the amplitude of the voltage at the output of the amplifier stage.

11. The system of claim 10 wherein the three state driver circuit comprises:
    a first transistor having an emitter, having a base, and having a collector;

a second transistor having an emitter connected to the emitter of the first transistor and forming the input of the three state driver circuit, having a base connected to the base of the first transistor and to a voltage reference, and having a collector;

a third transistor having an emitter connected to ground, having a base connected to the collector of the second transistor, and having a collector;

a fourth transistor having an emitter connected to a voltage source Vcc, having a base connected to the collector of the first transistor, and having a collector; and a fifth transistor having an emitter connected to the collector of the third transistor and forming the output of the three state driver circuit, having a base connected to the collector of the fourth transistor, and having a collector connected to the voltage source.

12. The system of claim 11 wherein the three state driver circuit further comprises a diode having an anode connected to the emitter of the fourth transistor and having a cathode connected to the collector of the fifth transistor as its voltage source.

13. The system of claim 11 wherein the first, third, and fifth transistors are NPN bipolar transistors.

14. The system of claim 11 wherein the second and fourth transistors are PNP bipolar transistors.

15. A circuit for driving a motor comprising:

a potentiometer coupled to the shaft of the motor, the potentiometer having an output;

an amplifier stage having a first input for receiving a control voltage, having a second input coupled to the output of the potentiometer, having a third input coupled to a reference voltage and having an output coupled to the first input of the motor; and a three state driver circuit having an input coupled to the output of the amplifier stage and having an output coupled to the second input of the motor, the output of the three state driver circuit being turned off when the output of the amplifier stage is at a steady state voltage, the amplitude of the voltage at the output of the three state driver circuit, when the three state driver circuit is mined on, being different from the amplitude of the voltage at the output of the amplifier stage.

16. The circuit of claim 15 wherein the three state driver circuit comprises:

a first transistor having an emitter, having a base, and having a collector;

a second transistor having an emitter coupled to the emitter of the first transistor and forming the input of the three state driver circuit, having a base coupled to the base of the first transistor and to a voltage reference, and having a collector;

a third transistor having an emitter coupled to ground, having a base coupled to the collector of the second transistor, and having a collector;

a fourth transistor having an emitter coupled to a voltage source Vcc, having a base coupled to the collector of the first transistor, and having a collector; and a fifth transistor having an emitter coupled to the collector of the third transistor and forming the output of the three state driver circuit, having a base coupled to the collector of the fourth transistor, and having a collector coupled to the voltage source.

17. The circuit of claim 16 wherein the three state driver circuit further comprises a diode having an anode coupled to the emitter of the fourth transistor and having a cathode coupled to the collector of the fifth transistor as its voltage source.

18. The circuit of claim 16 wherein the first, third, and fifth transistors are NPN bipolar transistors.

19. The circuit of claim 17 wherein the second and fourth transistors are PNP bipolar transistors.

* * * * *